(12) United States Patent
Mitsui et al.

(10) Patent No.: US 6,242,138 B1
(45) Date of Patent: Jun. 5, 2001

(54) PHASE SHIFT MASK AND PHASE SHIFT MASK BLANK

(75) Inventors: Masaru Mitsui, Yamanashi; Kimihiro Okada, Kofu; Hideki Suda, Hachioji, all of (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/634,480

(22) Filed: Aug. 8, 2000

Related U.S. Application Data

(63) Continuation of application No. 09/327,032, filed on Jun. 7, 1999, now Pat. No. 6,153,341, which is a continuation of application No. 08/825,068, filed on Mar. 27, 1997, now Pat. No. 5,942,356.

(30) Foreign Application Priority Data

Mar. 30, 1996 (JP) .................................................. 8-10441
Sep. 17, 1996 (JP) .................................................. 8-266658

(51) Int. Cl.[7] ......................................................... G03F 9/00
(52) U.S. Cl. .................................................................. 430/5
(58) Field of Search .............................. 430/5, 311, 322; 428/432; 204/192.11, 192.12

(56) References Cited

U.S. PATENT DOCUMENTS

| 5,631,109 | 5/1997 | Ito ............................................ 430/5 |
| 5,804,337 | 9/1998 | Mitsui ..................................... 430/5 |

FOREIGN PATENT DOCUMENTS 0 668 539 A2   2/1995   (EP) .

Primary Examiner—S. Rosasco
(74) Attorney, Agent, or Firm—Cook, Alex, McFarron, Manzo, Cummings & Mehler, Ltd.

(57) ABSTRACT

A half tone type phase shift mask as well as a phase shift mask blank for the mask is formed with a thin film light translucent portion made of essentially, nitrogen, metal, and silicon. The containing rate of each element and ratio in the thin film is specified in a certain range to improve film characteristics, such as acid resistance, photo resistance, conductivity, refractive index rate (film thickness), light transmission rate, etching selectivity, etc. of the light translucent portion. The phase shift mask satisfies optical characteristics (i.e., light transmitting rate and phase shift amount) with high precision, as well as reduces defects in the thin film.

19 Claims, 10 Drawing Sheets

FIG. 5

| | COMPOSITION (ATOMIC %) | | | TRANSMISSION RATE (%) | FILM THICKNESS (Å) | REFRACTIVE INDEX RATE |
| --- | --- | --- | --- | --- | --- | --- |
| | Mo | Si | O | N | | | |
| EMBODIMENT NO. 1 | 13 | 40 | 0 | 47 | 5 | 931 | 2.34 |
| COMPARATIVE EXAMPLE NO. 1 | 16 | 27 | 40 | 17 | 2 | 1378 | 1.90 |

FIG. 7

| | COMPOSITION (ATOMIC %) | | | | COMPOSITION RATIO Mo : Si | TRANSMISSION RATE (%) | FILM THICKNESS (Å) | REFRAC- TIVE INDEX RATE | ACID RESIS- TANCE | CONDUC- TIVITY (kΩ/□) |
|---|---|---|---|---|---|---|---|---|---|---|
| | O | N | Si | Mo | | | | | | |
| EMBODIMENT NO. 2 | 0 | 48 | 34 | 18 | 1 : 1.88 | 2 | 855 | 2.45 | △ | 200 |
| EMBODIMENT NO. 3 | 0 | 47 | 40 | 13 | 1 : 3.07 | 5 | 925 | 2.34 | ○ | 600 |
| EMBODIMENT NO. 4 | 0 | 47 | 45 | 8 | 1 : 5.62 | 7 | 969 | 2.28 | ○ | 1500 |
| COMPARATIVE EXAMPLE NO. 2 | 58 | 15 | 17 | 10 | 1 : 1.70 | 5 | 1278 | 1.97 | × | 8000 |

FIG. 8

| | COMPOSITION (ATOMIC %) | | | | COMPOSITION RATIO Mo : Si | TRANSMISSION RATE (%) | FILM THICKNESS (Å) | REFRACTIVE INDEX RATE | ACID RESISTANCE | CONDUCTIVITY (kΩ/□) |
|---|---|---|---|---|---|---|---|---|---|---|
| | O | N | Si | Mo | | | | | | |
| EMBODIMENT NO. 5 | 0 | 41 | 44 | 15 | 1 : 2.93 | 4 | 1106 | 2.65 | ○ | 12 |
| EMBODIMENT NO. 6 | 0 | 42 | 43 | 15 | 1 : 2.86 | 6 | 1141 | 2.60 | ○ | 44 |
| EMBODIMENT NO. 7 | 0 | 44 | 42 | 14 | 1 : 3.00 | 8 | 1177 | 2.55 | ○ | 150 |
| COMPARATIVE EXAMPLE NO. 3 | 31 | 16 | 31 | 22 | 1 : 1.41 | 4 | 1495 | 2.22 | ○ | 50 |
| COMPARATIVE EXAMPLE NO. 4 | 33 | 17 | 30 | 20 | 1 : 1.50 | 6 | 1600 | 2.14 | ○ | 200 |
| COMPARATIVE EXAMPLE NO. 5 | 35 | 20 | 28 | 17 | 1 : 1.65 | 8 | 1705 | 2.07 | △ | 400 |

PHASE SHIFT MASK AND PHASE SHIFT MASK BLANK

This application is a a continuation of copending U.S. applicaition Ser. No. 09/327,032 filed Jun. 7, 1999 now U.S. Pat. No. 6,153,341 which is a continuation of U.S. application Ser. No. 08/825,068, filed on Mar. 27, 1997 (now U.S. Pat. No. 5,942,356).

BACKGROUND OF INVENTION

1) Field of Invention

This invention relates to a phase shift mask capable of transferring patterns with an improved resolution upon placing phase differentials between exposure light rays that pass through the mask, a phase shift mask blank as a material for the phase shift mask, and a manufacturing method for the phase shift mask, and, more particularly, to a half tone type phase shift mask, and blank and manufacturing method for the mask.

2) Related Arts

It has been recently turned out that mere increase of numerical aperture of exposure apparatus' lens or mere reduction of wavelength of exposure apparatus' beam cannot improve practical resolution for lithography, since two key factors, rendition of higher resolution and assurance of depth of focus, required for lithography are in a trade-off relation.

Under this situation, phase shift lithography is getting attentions as lithography of the next generation. The phase shift lithography is a method to improve photo lithography's resolution by changing only masks without changing any optical system, and can grossly improve the resolution in using interference between transmission light rays upon placing phase differentials between exposure light rays that pass through the photo masks. Such a phase shift mask is a mask in common possession of light intensity information and phase information, and is categorized in several types such as, so-called Levenson, auxiliary pattern, self-aligrment (edge enhancement), or the like. Those phase shift masks have more complicated structures in comparison with those of conventional photo masks which possess only light intensity information, and require a higher level of technology in regard of manufacturing.

As one of such phase shift masks, a phase shift mask referred as to a half tone type phase shift mask has been developed these days. In such a half tone phase shift mask, its light translucent portion (photo semi-transmission portion) produces a light shield function in which exposure light is substantially shielded and a phase shift function in which phase of light is shifted (ordinarily reversed), and therefore, the half tone phase shift mask, without necessity to form separately a light-shield film pattern and a phase shift film pattern, has a feature that the structure of the mask can be made simple and that a manufacturing process of the mask can become easy.

A typical conventional half tone type phase shift mask is shown in FIG. 1. The half tone type phase shift mask has on a transparent substrate 1 a mask pattern, which is as shown in FIG. 1(a) composed of a light transmitting portion (a photo transmission portion) (exposure areas of the transparent substrate) 2 through which light with intensity capable of substantially contributing to the exposure process passes, and a light translucent portion (light shield and phase shift portion) 3 through which light with intensity unable to substantially contribute to the exposure process passes. The phase of light passing through the light translucent portion is shifted, and the phase of the light that has passed through the light translucent portion thereby enters a substantially reverse relation with the phase of light that has passed through the light transmitting portion (see FIG. 1(b)); lights passing through boundaries or their vicinities between the light translucent portion and the light transmitting portion and diffracting as to encroach one another due to diffraction phenomenon behave to cancel one another; the light thereby improves the contrast at the boundaries, or the resolution, while the light intensity around the boundaries are nearly nullified.

Meanwhile, the light translucent portion for the half tone type phase shift mask described above must have the optimum values for the transmittancy or transmission rate and the phase shift amount. It has been known that such optimum values in a phase shift mask can be realized by a single layer of the light transmitting portion. Such a phase shift mask has a light transmitting portion made by a thin film made of, as a material or materials essentially, metals such as molybdenum, silicon, and oxygen. They are such as molybdenum silicides, more specifically, oxides of molybdenum silicon ("MoSiO system material"), or nitride oxides of molybdenum silicon ("MoSiON system material"). According to those materials, transmittancy can be controlled by selecting the containing amount of the oxygen or the nitrogen and oxygen, while the thickness of the thin film can control the phase shift amount. When formed of those materials, the light transmitting portion can be structured by a single layer film made of a single kind material, thereby simplifying the film formation process in comparison with a case where it is made of multilayer film made of multiple materials, and thereby simplifying the manufacturing process since a single etchant can be used.

However, the molybdenum silicide film or the molybdenum silicide nitride oxide film, as elements composing the light translucent portion of the phase shift mask is weak against acid, such as sulfuric acid, used for primer or rinse fluid for rinsing during mask manufacturing or when masks are used. In particular, where the transmission rate and phase shift amount of the light translucent portion is set for KrF excimer laser beam (248 nanometers), the attenuation constant (K) must be small, and to realize a small attenuation constant, degree of oxidation or nitriding oxidation has to be increased sufficiently. If the oxidation degree is so increased, acid resistance of the light translucent portion is significantly lowered, thereby raising a problem that the transmission rate and phase shift amount thus set may be deviated.

While a film for phase shift mask blanks is formed, oxide tends to deposit on target surfaces, especially on non-erosion areas as the degree of oxidation or nitriding oxidation increases, and makes electrical discharge of the film unstable. Consequently, the transmission rate and phase shift amount is poorly controlled, thereby raising a problem that the blanks are formed with defects. Moreover, since the relationship between the composition of the film and film characteristics such as acid resistance, photo resistance, conductivity, deflection rate (thickness), transmission rate, selectivity of etching, etc. remains unsolved, the optimum film characteristics cannot be obtained in consideration of the manufacturing process or the likes even if the required optimum values for both of the transmission rate and the phase shift amount are obtained at the stage of blanks, and therefore those values are deviated from the designed or set values through experiencing the manufacturing process, resulting in disability to form the optimum phase shift masks.

SUMMERY OF INVENTION

It is an object of the invention to provide a phase shift mask having a light translucent portion of good film characteristics such as acid resistance, photo resistance (durabillity against light (UV irradiation)), conductivity, deflection rate (thickness), transmission rate, phase shift amount, selectivity of etching, etc. and a blank for the phase shift mask.

It is another object of the invention to provide a manufacturing method for the blank for the phase shift mask with a light translucent portion of excellent film characteristics.

In one form of the invention, a phase shift mask for exposure of a very fine pattern, has a transparent substrate and a mask pattern formed on the transparent substrate. The mask pattern has a light transmitting portion transmitting light having intensity substantially contributing to the exposure and a light translucent portion transmitting light having intensity substantially not contributing to the exposure. The light translucent portion shifts a phase of the light having passed through the light translucent portion to cancel, by rendering the phase of the light having transmitted through the light translucent portion differentiated from a phase of the light having transmitted through the light transmitting portion, intensity of light transmitted around through a boundary located between the light translucent portion and the light transmitting portion for an improvement of a contrast at the boundary. The light translucent portion is formed of a thin film made of a material including essentially nitrogen, metal, and silicon whose containing rate is set at thirty atomic per cent or greater and at sixty atomic per cent or less.

In another form of the invention, the phase shift mask has a specific range of sheet resistance in lieu of the specific range of the containing rate of silicon. In this phase shift mask, a sheet resistance of the substrate on which the thin film is formed is set at one kilo ohm per square or greater and at one point five mega ohm per square or less.

According to a preferred embodiment of the invention, the ratio of the metal to the silicon is one to one point five or greater and one to six or less. The containing rate of the nitrogen may be set at thirty atomic percent or greater and at sixty atomic per cent or less, and preferably, the containing rate of the nitrogen is set higher than the containing rate of the silicon. The metal for the phase shift mask of the invention can be made of, but not limited to molybdenum.

According to another preferred embodiment of the invention, a phase shift mask blank is manufactured by preparing a target containing silicon of seventy to ninety mole per cent and metal, and sputtering atoms from the target in an atmosphere including nitrogen to form a phase shift layer including nitrogen, metal, and silicon. Such a phase shift mask blank may be formed with a transparent substrate, and a thin film made of a material essentially including nitrogen, metal, and silicon.

BRIEF DESCRIPTION OF DRAWINGS

The above and other objects and features of the invention are apparent to those skilled in the art from the following preferred embodiments thereof when considered in conjunction with the accompanied drawings, in which:

FIG. 5 is a diagram showing film composition and film characteristics;

FIGS. 7, 8 are diagrams showing film composition and film characteristics;

DETAILED DESCRIPTION OF PREFERRED EMBODIMENTS

Figure 1:
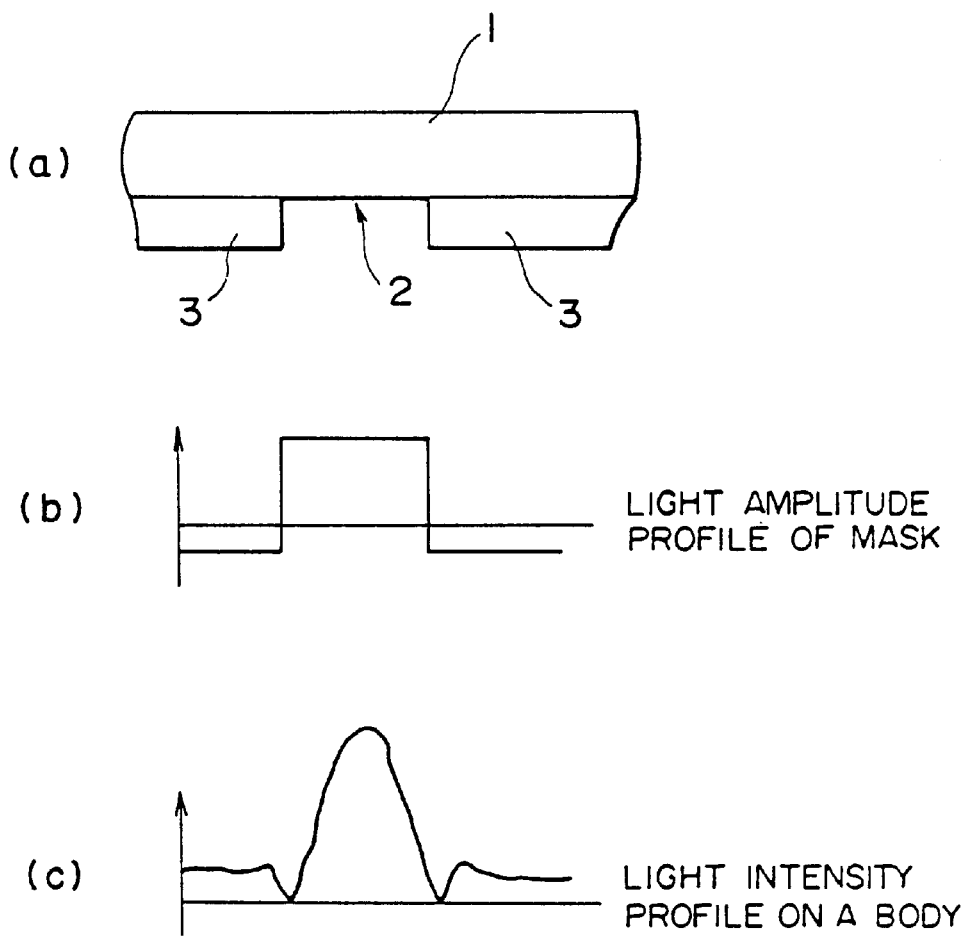
FIG. 1 is a diagram illustrating a transfer mechanism of a conventional half tone type phase shift mask.

Now, a phase shift mask according to the invention is described. The phase shift mask has a light translucent portion, which is formed by a thin film made of a material essentially composed of metal, silicon, and nitrogen. The thin film, though insufficient, has an improved acid resistance and produces stable discharges, in Comparison with a thin film containing oxygen, because the light translucent portion is formed by the thin film without containing oxygen. As the metal to form such a thin film, molybdenum, tantalum, tungsten, titanium, chromium, etc. are exemplified. There is no simple explanation about binding conditions of the material constituting the light translucent portion. This is because it may be improper to describe the material with simplified formulas where, e.g., SiN, MoSiN, MoN, etc. are complexly related in molybdenum silicon nitrides. In addition, there is no simple explanation about rates of compositions because, e.g., composition rates may vary in a depth or thickness direction.

As a material essentially including metal, silicon, and nitrogen for constituting the photo semi-transmission portion, specifically, for example, molybdenum silicon nitride (referred as to "MoSiN system material"), tantalum silicon nitride (referred as to "TaSiN system material"), tungsten and silicon nitride (referred as to "TiSiN system material"), titanium silicon nitride (referred as to "TiSiN system material"), etc. are exemplified. Those materials can contain, as compounds or mixtures of those materials, a small or proper amount of carbon, hydrogen, fluorine, helium, etc. as far as it does not affect the functions of the light translucent portion. The material constituting the light translucent portion may be formed of, e.g., nitrides of molybdenum silicide, tantalum silicide, or tungsten silicide, or mixtures of one or more of those nitrides and silicon nitride or/and metal nitride. The material constituting the light translucent portion may also be formed of one or more of conventionally known materials, such as molybdenum silicide nitride (MoSiN), tantalum silicide nitride (TaSiN), tungsten silicide nitride (WSiN), titanium silicide nitride (TiSiN).

The light translucent portion commonly serves for a light-shield function in which the exposure light is substantially cut off and for a phase shift function in which the phase of light is shifted. Set values for those functions depend on a light source of the exposure when the mask is used and its wavelength. It is therefore required to select or design the set values corresponding to the exposure light source and its wavelength. As an exposure light source and its wavelength, e.g., mercury lamp I-line(wavelength=365 nanometers), mercury lamp G-line(wavelength=436 nanometers), KrF excimer laser (wavelength=248 nanometers), ArF excimer laser (wavelength=193 nanometers), etc. are exemplified.

A phase shift amount at the light translucent portion is controlled by adjusting the refractive index rate (including the attenuation constant) of the film composition (containing rates of nitrogen, silicon, and metal (atomic per cent)) of the light translucent portion and the film thickness. Assuming that the phase shift amount is φ; the wavelength of the exposure light is λ; and the refractive index rate is n, the thickness d of the light translucent portion can be determined by the following Formula (1).

$$d=(\phi/360)\times[\lambda/(n-1)] \qquad (1)$$

The phase shift amount in Formula (1) is preferably 180 degrees in terms of improvements of the resolution, but the amount can be practically 160 to 200 degrees.

The light translucent portion's light transmission rate (light-shield performance) to the exposure light is generally about 2 to 20 per cent, preferably, although it depends on sensitivity of the resist that is used for forming patterns of semiconductor devices. A higher light transmission rate in this range is preferred because the higher transmission rate has higher phase effects. However, in the case of line and space patterns, a lower light transmission rate is preferable, while a higher light transmission rate is preferable in the case of hole system patterns. The light transmission rate of the light translucent portion is controllable by adjusting mainly the containing rates of nitrogen, silicon, and metal (atomic per cent) in the thin film constituting the light translucent portion.

This invention has feature that the containing rate (atomic per cent) and ratio of each element in the thin film made of a material essentially including nitrogen, metal, and silicon are specified. Although it is an absolute condition required for the light translucent portion when made of a single layer film to satisfy at the same time the optimum values for both of the light transmission rate and the phase shift amount f, such a condition is not enough and the composition of the thin film constituting the light translucent portion should be determined in consideration of the manufacturing process or the likes. More specifically, for example, it is necessary to form a film composition that is strong against acid attack such as of sulfuric acid used as primer or rinse fluid for rinsing during the mask manufacturing process or while the mask is in use and that set transmission rate and phase difference will not be deviated due to acid rinsing. To ensure the stability of the film and to prevent the film from charging up during the mask's fabrication, the film composition is necessarily-to have good conductivity. Specifically, during film formations of the phase shift mask blank, compounds (e.g., oxides) tend to deposit on the surface of the target, especially on non-erosion areas, rendering unstable discharging, impairing controllability of the transmission rate and film thickness, and likely causing defects to the blanks. If the mask blanks have bad conductivity, charging up during mask fabrications makes scanning disable or reduces precision of scanning, and likely causes to create defective masks. It is also necessary to form a film composition having a relatively high refractive index rate capable of making thinner the thickness needed for reversing the phase. This is because making the thickness thinner improves the productivity of the mask and because smaller vertical differences in the mask pattern can reduce pattern destruction during rinsing (or scrub rinsing or the like) due to mechanical friction. Moreover, it is necessary to form a film composition having excellent selectivity of etching to a quartz substrate or the like. This is to minimize an etching amount of the quartz substrate or the like and to avoid changes of the phase shift amount f.

With the phase shift mask according to the invention, regarding above concerns, the containing rate (atomic per cent) and ratio of each element in the thin film constituting the light translucent portion is specified. The film composition in a region within a certain depth from the surface, or the surface layer, of the light translucent portion is particularly important because it affects easiness of rinsing and conductivity.

According to the phase shift mask, the containing rate of silicon in the thin film made of a material essentially including nitrogen, metal, and silicon constituting the light translucent portion is set at 30 to 60 atomic per cent. The containing rate of silicon mainly affects the light transmission rate. If the containing rate of silicon is less than 30 atomic per cent, a high transmission rate becomes difficult to be obtained. If the containing rate of silicon exceeds 60 atomic per cent, the etching selectivity to the quartz substrate or the like is lowered. Therefore, the containing rate of silicon is more preferably at 40 to 50 atomic per cent.

According to the phase shift mask, the ratio of metal to silicon by atomic per cent in the thin film made of the material essentially including nitrogen, metal, and silicon, which are constituting the light translucent portion is preferably at 1 to 1.5 to 6.0. The ratio of metal to silicon mainly affects the acid resistance and the photo resistance. If the ratio of metal to silicon is less than 1 to 1.8, the film lacks good acid resistance. If the ratio exceeds 1 to 6.0, the electric resistance becomes high. Therefore, the preferable ratio of metal to silicon is 1 to 2.0 to 5.0.

According to the phase shift mask, the containing rate of nitrogen in the thin film made of a material essentially including nitrogen, metal, and silicon constituting the light translucent portion is preferably set at 30 to 60 atomic per cent. The containing rate of nitrogen, as well as that of silicon, mainly affects the light transmission rate and etching characteristics. If the containing rate of nitrogen is less than 30 atomic per cent, a high transmission rate becomes difficult to be obtained. If the containing rate of nitrogen exceeds 60 atomic per cent, the etching rate becomes extremely high, thereby making the CD control difficult.

According to the phase shift mask, it is preferred to set thin film's conductivity or the sheet resistance of the substrate (or blank) on which the thin film is formed at 1 kilo ohm to 1.5 mega ohm per square, by specifying the containing rate (atomic per cent) and ratio of each element in the thin film made of the material essentially including nitrogen, metal, and silicon constituting the light translucent portion. The conductivity (sheet resistance) mainly affects discharge stability of the sputtering target during film formations and preventive performance of charging up during mask fabrications. The sheet resistance is preferably at 1.5 mega ohm per square or less; particularly, it is preferred that the sheet resistance is 1 mega ohm per square or less to obtain the discharge stability during film formations; it is further preferred that the sheet resistance is 0.5 mega ohm per square or less to prevent charging up during mask fabrications. To obtain a thin film of the composition thus described while ensuring the discharge stability during film formations, it is preferred to form a phase shift layer including nitrogen, metal, and silicon by sputtering atoms in an atmosphere inclusive of nitrogen from a target that contains 70 to 95 mol per cent silicon and metal, in order to fabricate the phase shift mask blanks. This is because the process is subject to bad conductivity (or hard to feed voltage) at the target surface (erosion area) during DC sputtering if the containing rate of silicon in the target is greater than 95 mol per cent, thereby causing discharges unstable.

On the other hand, if the silicon's containing rate is less than 70 mol per cent, a thin film for constituting a high transmission rate light translucent portion cannot be obtained. Such discharge stability during film formations affects film quality, and if films are formed under good discharge stability, the light translucent portion will have good quality.

Figure 2:
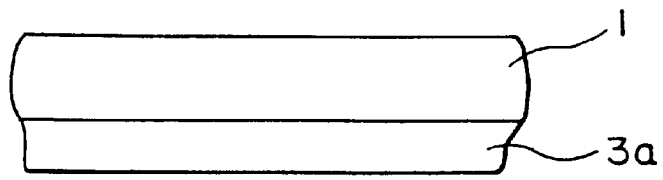
FIG. 2 is a partial cross section showing a half tone type phase shift mask blank.

As shown in FIG. 2, a phase shift mask blank is formed where a light translucent film 3a is formed on a transparent substrate 1. In the phase shift mask and the manufacturing method thus described, the transparent substitute is not limited as far as transparent with respect to the exposure wavelength. As such a transparent substrate, for example, a quartz substrate, a silica substrate, or other glass substrates (e.g., soda lime glass, aluminosilicate glass, aluminoborosilicate glass, etc.) are exemplified. Patterns (patterning and mask treatment process) can be formed by known lithography techniques (coating resist, exposure, development, etching, removal of resist, and rinse) with photo or electron beam, and are not limited.

The following detailed descriptions are based on our experiments, which indicate the feature of the phase shift mask according to this invention.

Embodiment No. 1
Fabrication of Blank

A light translucent film made of a molybdenum silicon nitride (MoSiN system material) thin film was formed on a surface of a transparent substrate; this was for a phase shift mask blank for KrF excimer laser (wavelength 248 nanometers). More specifically, using a mixing target (Mo:Si=20:80 mol %) of molybdenum (Mo) and silicon (Si), a molybdenum silicon nitride (MoSiN) thin film, whose thickness was 931 angstroms, was formed on the transparent substrate by reactive sputtering in a mixture gas atmosphere (Ar 10%, $N_2$ 90%, pressure $1.5 \times 10^{-3}$ Torr) of Argon (Ar) and nitrogen ($N_2$).

Figure 3:
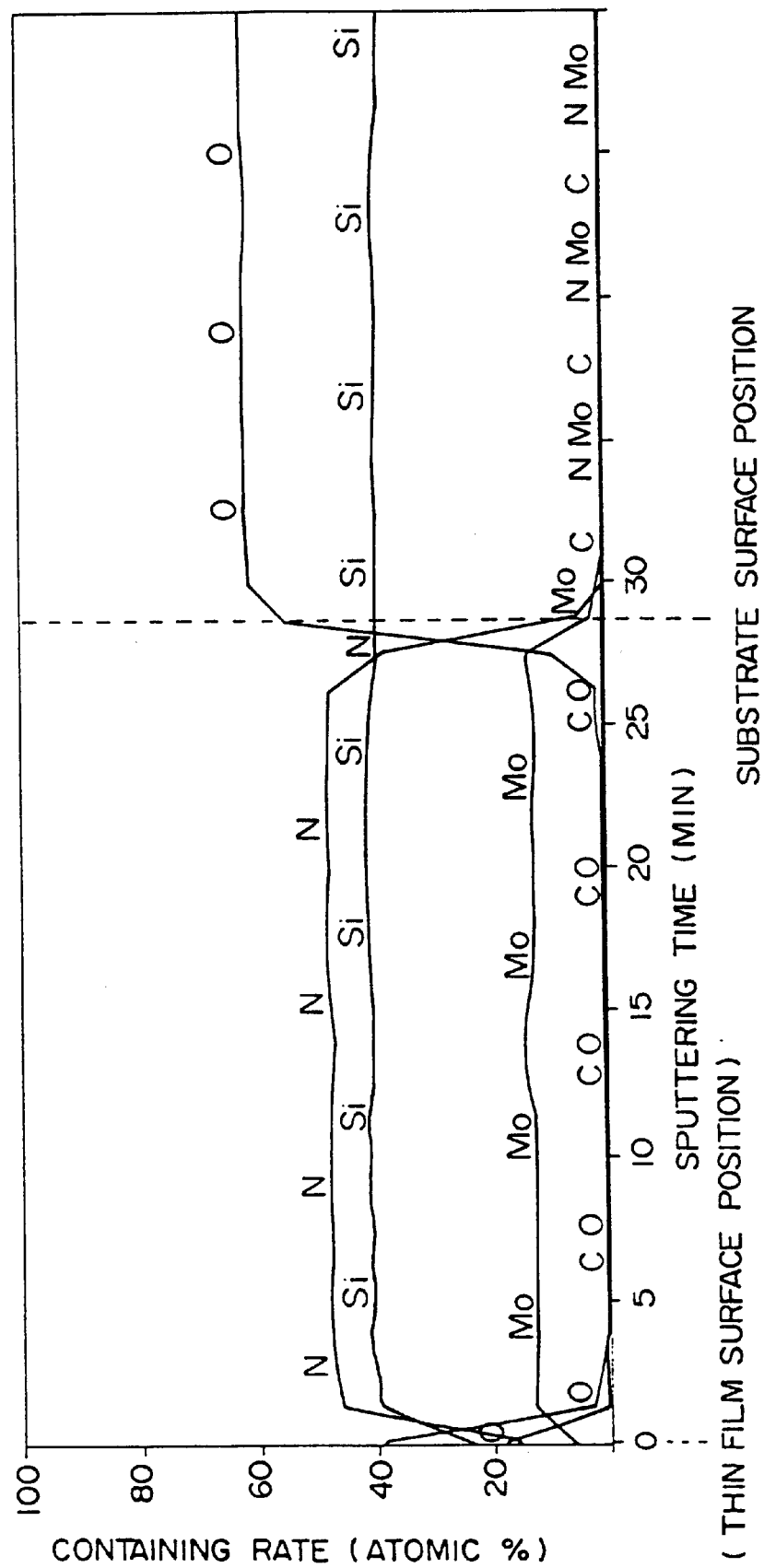
FIG. 3 is a diagram showing ESCA analysis results of a light translucent film in Embodiment No. 1.

FIG. 3 shows the ESCA analysis results of the light translucent film thus obtained. According to FIG. 3, the film composition of the light translucent film (as average of entire samples) was Mo, 12.5 atomic per cent; Si, 40.2 atomic per cent; N, 47.3 atomic per cent. Based on the ESCA analysis results, oxygen was detected on the sides of the quartz substrate and surface of the light translucent film. The surface side of the light translucent film was oxidized after the film formation. On the side of the substrate, oxygen of silicon oxide was detected at the boundary. When the film was thus oxidized, the containing rate of nitrogen at portions thus oxidized may be lowered more than the suitable range of 30 to 60 atomic per cent. Such values of those compositions in this invention are viewed of main body of the film except the surface and substrate sides in a film's thickness direction. It is to be noted that in the light translucent film, the essential portion containing no oxygen is about 87.5% of the entire thickness, whereas a portion containing oxygen on the quartz substrate side is about 8.0% of the entire thickness and a portion containing oxygen on the surface side is about 4.5% or less of the entire thickness.

Figure 4:
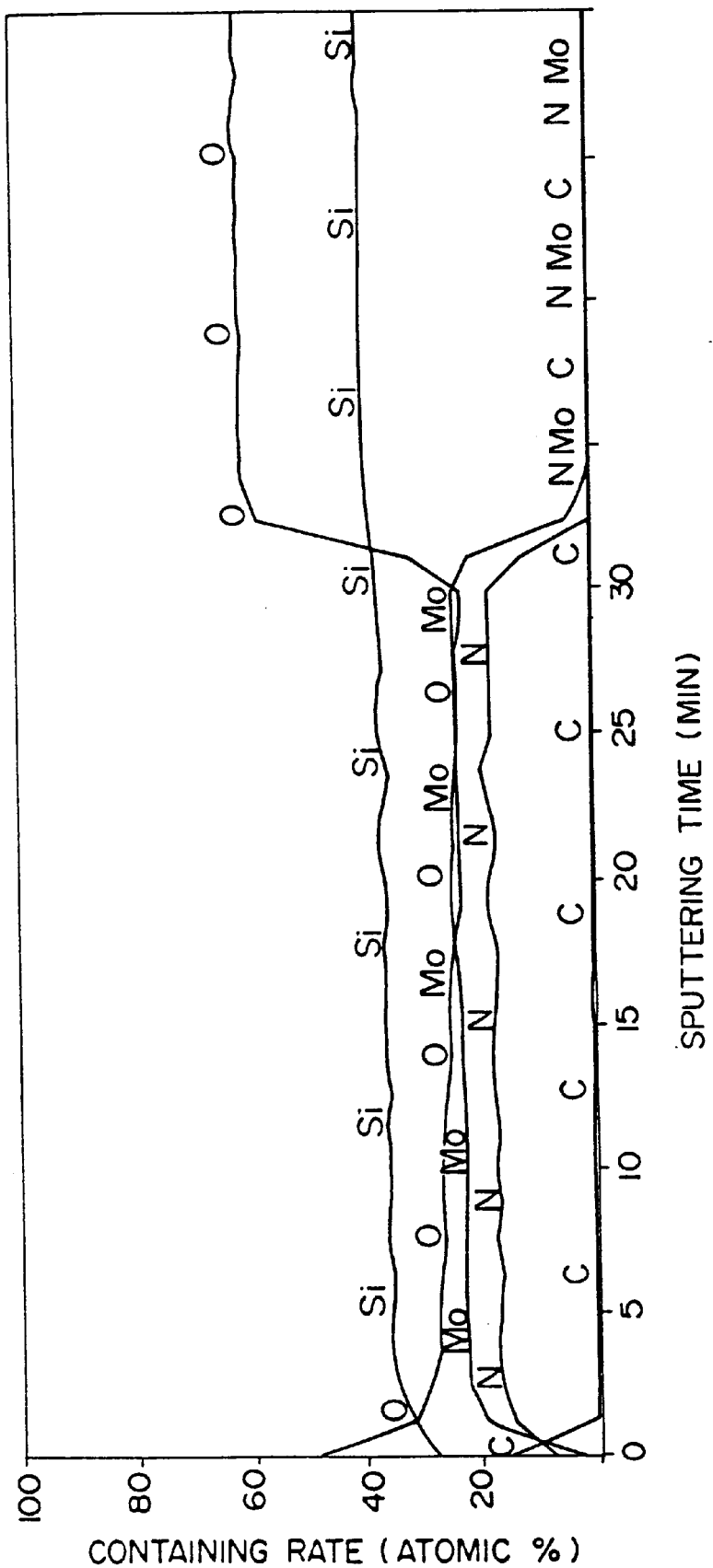
FIG. 4 is a diagram showing ESCA analysis results of a light translucent film (MoSiON)

As a reference, FIG. 4 shows ESCA analysis results of the light translucent film made of molybdenum and silicon nitride oxide (MoSiON). According to the phase shift mask of the invention, when a thin film of molybdenum silicon nitride is formed, oxygen may be contained at the quartz substrate and surface sides of the light translucent film as described above(though not necessarily be contained), and therefore, for example, the MoSiN film of the essential portion containing no oxygen and the film on the surface side containing oxygen may interact to each other to some extent. To this extent, the thin film made of molybdenum silicide nitride MoSiN according to the invention includes a film thus containing oxygen around the surface.

Although the ESCA analysis results did not detect almost any oxygen at the essential portion of the light translucent film, oxygen can be contained as much as substantially not affecting the film quality. Specifically, oxygen ($O_2$) of an amount of 5 atomic per cent or less can be contained in the light translucent film.

Figure 6:
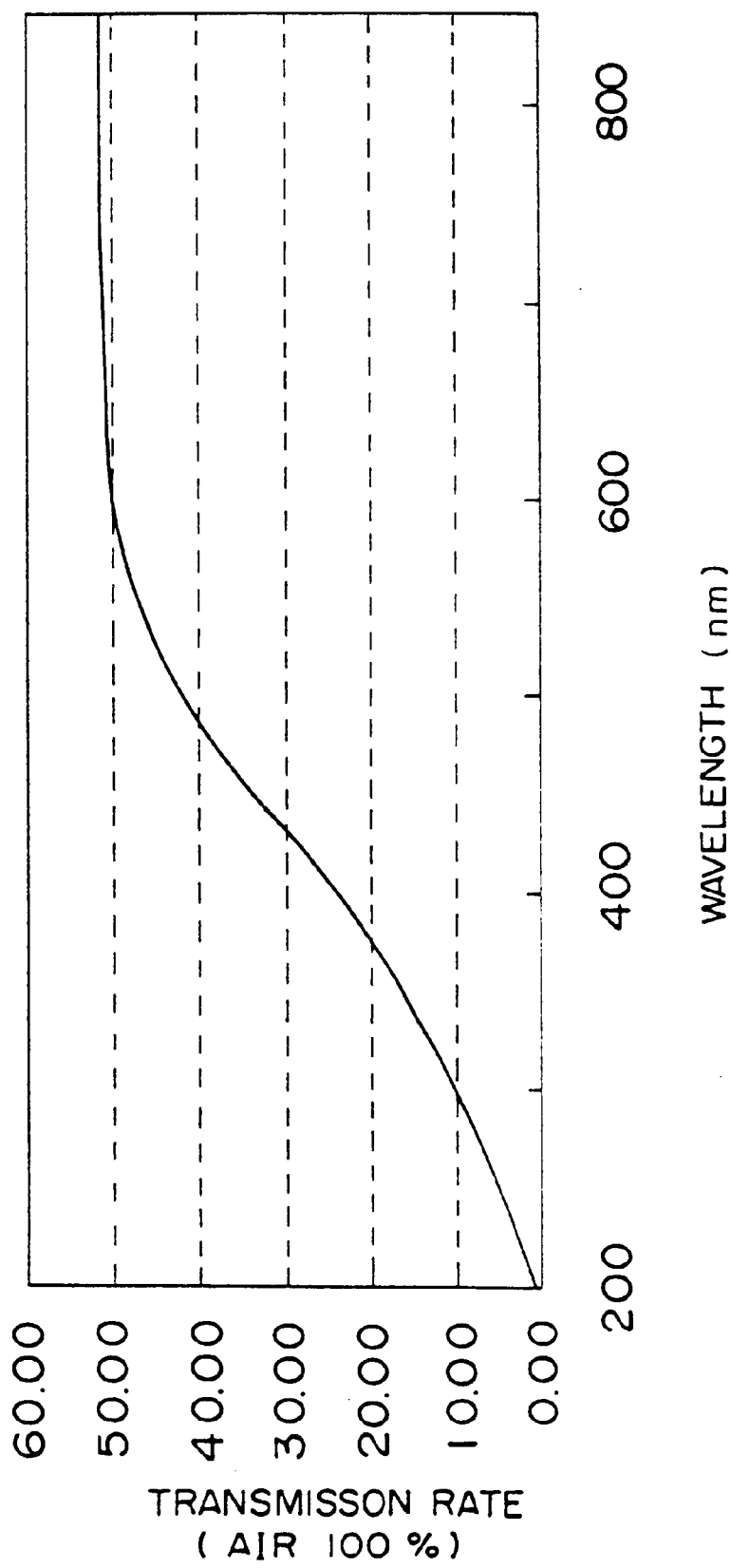
FIG. 6 is a diagram showing wavelength dependency of light transmission rate in Embodiment No. 1.

FIG. 5 shows the film composition (average of the entire films) and film characteristics (transmission rate, film thickness, and refractive index rate at wavelength 248 nanometers). FIG. 6 shows a graph indicative of wavelength dependency of the light transmission rate of the phase shift mask blank thus obtained. The light transmission rate of the obtained phase shift mask blank was 5 per cent at wavelength 248 nanometers, 19 per cent at wavelength 365 nanometers, and 40 per cent at wavelength 488 nanometers. The phase shift amount (phase angle) f of the phase shift mask blank was 181 degrees, where the refractive index was 2.34. The light transmission rate was measured in use of a spectrophotometry instrument (Shimazu Seisakusho K. K. made: UV-2400PC), and the phase angle was measured in use of a phase differential measurement instrument (Lasertech K. K. made: MPM-248).

Comparative Example No. 1
Fabrication of Blank

A light translucent film made of a molybdenum silicon nitride oxide (MoSiON) thin film was formed on a surface of a transparent substrate; this was for a phase shift mask blank for KrF excimer laser (wavelength 248 nanometers). More specifically, using a mixing target (Mo:Si=33:67 mol %) of molybdenum (Mo) and silicon (Si), a molybdenum silicon nitride oxide (MoSiON) thin film, whose thickness was 1378 angstroms, was formed on the transparent substrate by reactive sputtering in a mixture gas atmosphere (Ar 84%, $N_2O$ 16%, pressure $1.5 \times 10^{-3}$ Torr) of Argon (Ar) and suboxide nitrogen ($N_2O$).

FIG. 5 shows the film composition (average of the entire film) and film characteristics (transmission rate, film thickness, and refractive index rate at wavelength 248 nanometers). The phase shift amount (phase angle) f of the obtained phase shift mask blank at wavelength 248 nanometers was 180 degrees, where the refractive index was 1.90. As apparent from Embodiment No. 1, Comparative Example No. 1, and FIG. 5, a thinner film thickness can be enough to gain the phase difference of 180 degrees upon forming the thin film made of molybdenum silicon nitride (MoSiN) rather than made of molybdenum silicon nitride oxide (MoSiON) because the refractive index is greater.

Next, the acid resistance, photo resistance, conductivity when the film composition and film composition ratio are changed was explored.

Embodiment No. 2
Fabrication of Blank

A light translucent film made of a molybdenum silicon nitride (MoSiN system material) thin film was formed on a surface of a transparent substrate; this was for a phase shift mask blank for KrF excimer laser (wavelength 248 nanometers). More specifically, using a mixing target (Mo:Si=30:70 mol %) of molybdenum (Mo) and silicon (Si), a molybdenum silicon nitride (MoSiN) thin film, whose thickness was 855 angstroms, was formed on the transparent substrate by reactive sputtering in a mixture gas atmosphere (Ar 10%, $N_2$ 90%, pressure $1.5 \times 10^{-3}$ Torr) of Argon (Ar) and nitrogen ($N_2$). The light transmission rate of the obtained phase shift mask blank at wavelength 248 nanometers was 2 per cent; the phase shift amount (phase angle) f was about 180 degrees. The light transmission rate was measured using a magnetic spectrophotometer (Hitachi K. K. made, model 340); the phase angle was measured using a phase differential measurement instrument (Lasertech K. K. made: MPM-248).

FIG. 7 shows the film composition (average of the entire films, including the film composition ratio) and film characteristics (transmission rate, film thickness, and refractive index rate, acid resistance, and conductivity). Regarding the acid resistance, a mark circle represents no change; a triangle mark represents small changes within a permissive range; and a cross mark represents great changes out of the permissive range, where the samples were dipped in hot concentrated sulfuric acid at 120 Celsius degrees for two hours.

Mask Fabrication

A resist film was formed on a thin film made of molybdenum silicon nitride (MoSiN) for the phase shift mask blank, and then a resist pattern was formed by selective exposure and development. The exposed portions of the thin film made of molybdenum silicon nitride (MoSiN) were then removed by etching (dry etching with $CF_4+O_2$ gases) to obtain a thin film pattern (holes and dots) made of molybdenum silicon nitride. After removal of the resist, the film was dipped in 98% sulfuric acid ($H_2SO_4$), 100 Celsius degrees for fifteen minutes and then rinsed by sulfuric acid, and phase shift masks for KrF excimer laser were obtained after rinsed with pure water or the like.

Embodiment No. 3

A phase shift mask blank and a phase shift mask were obtained in the same manner as Embodiment No. 2 except that using a mixing target in which the ratio of molybdenum to silicon was changed (Mo:Si=20:80 mol %) a molybdenum silicon nitride (MoSiN) thin film was formed (with the thickness 925 angstroms) on a transparent substrate. FIG. 7 shows the film composition and film characteristics.

Embodiment No. 4

A phase shift mask blank and a phase shift mask were obtained in the same manner as Embodiment No. 2 except that using a mixing target in which the ratio of molybdenum to silicon was changed (Mo:Si=10:90 mol %) a molybdenum silicon nitride (MoSiN) thin film was formed (with the thickness 969 angstroms) on a transparent substrate. FIG. 7 shows the film composition and film characteristics.

Comparative Example No. 2

Fabrication of Blank

A light translucent film made of a molybdenum silicon nitride oxide (MoSiON) thin film was formed on a surface of a transparent substrate; this was for a phase shift mask blank for KrF excimer laser (wavelength 248 nanometers). more specifically, a phase shift mask blank and a phase shift mask were obtained in the same manner as Embodiment No. 2 except that using a mixing target (Mo:Si=33:67 mol %) of molybdenum (Mo) and silicon (Si), a molybdenum silicon nitride oxide (MoSiON) thin film, whose thickness was 1278 angstroms, was formed on the transparent substrate by reactive sputtering in a mixture gas atmosphere (Ar 76%, $N_2O$ 24%, pressure $1.5 \times 10^{-3}$ Torr) of Argon (Ar) and suboxide nitrogen ($N_2O$). FIG. 7 shows the film composition and film characteristics.

Embodiments 5 to 7

Fabrication of Blank

A light translucent film made of a molybdenum silicon nitride (MoSiN) thin film was formed on a surface of a transparent substrate; this was for a phase shift mask blank for I-line (wavelength 365 nanometers). More specifically, a phase shift mask blank and a phase shift mask were obtained in the same manner as Embodiment No. 2 except that using a mixing target (Mo:Si=20:80 mol %) of molybdenum (Mo) and silicon (Si), a molybdenum silicon nitride (MoSiN) thin film, whose thickness was 1106 to 1177 angstroms, was formed on the transparent substrate by reactive sputtering in a mixture gas atmosphere (Ar 62 to 52%, $N_2$ 38 to 48%, pressure $1.5 \times 10^{-3}$Torr) of Argon (Ar) and nitrogen ($N_2$). FIG. 8 shows the film composition and film characteristics. The light transmission rate was measured using a magnetic spectrop,hotometer (Hitachi K. K. made, model 340); the phase angle was measured using a phase differential measurement instrument (Lasertech K. K. made: MPM-100).

Comparative Examples 3 to 5

Fabrication of Blank

A light translucent film made of a molybdenum silicon nitride oxide (MoSiON) thin film was formed on a surface of a transparent substrate; this was for a phase shift mask blank for I-line (wavelength 365 nanometers). More specifically, a phase shift mask blank and a phase shift mask were obtained in the same manner as Embodiments No. 5 to 7 except that using a mixing target (Mo:Si=33:67 mol %) of molybdenum (Mo) and silicon (Si), a molybdenum silicon nitride oxide (MoSiON) thin film was formed on the transparent substrate by reactive sputtering in a mixture gas atmosphere [(Comparative Example No. 3, Ar 86%, $N_2O$ 14%, pressure $1.5 \times 10^{-6}$ Torr), (Comparative Example No. 4, Ar 85%, $N_2O$ 14%, pressure $1.5 \times 10^{-3}$ Torr), (Comparative Example No. 5, Ar 83%, $N_2O$ 17%, pressure $1.5 \times 10^{-6}$ Torr) of Argon (Ar) and nitrogen ($N_2$). FIG. 8 shows the film composition and film characteristics.

Evaluation

Film composition and film characteristics

As apparent from FIG. 7, where silicon in the film exists less, the transmission rate becomes worse and the acid resistance is impaired. To the contrary, where silicon in the film exists greater, the transmission rate and the acid resistance will be improved. Therefore, the silicon containing rate in the film is preferably 30% or more, and more preferably 40% or more in consideration of the acid resistance. It was also turned out that if the film contains too much silicon, the electrical resistance becomes higher. Therefore, it is preferred that the silicon containing rate (atomic per cent) in the film is 60% or less. As apparent from FIGS. 7, 8, the refractive index rate and film thickness is controllable by adjusting the composition in the film. According to the phase shift mask, since the refractive index rate can be made relatively high, and the film thickness can be made extremely thinner to reverse the phase, the phase shift mask can improve its productivity, as a matter of course; since height differences of the mask pattern can be made smaller, the mask can reduce pattern destruction during rinsing due to mechanical friction or the like; since the etching speed can be made very fast, the quartz substrate or the like can be selectively etched well.

Conductivity

As apparent from FIGS. 7. 8, the conductivity (sheet resistance) is controllable by adjusting the composition in the film. The sheet resistance is preferably 1500 kilo ohm per square, more preferably 1000 kilo ohm per square to secure the discharge stability during film formations, and further preferably 500 kilo ohm per square to prevent charging up during mask fabrications. As shown in FIGS. 7, 8, in the case of Comparative Example No. 2, the film itself has bad conductivity, and nitride oxide deposits on the non-erosion areas on the MoSi target during film formations, so that discharge becomes unstable. Accordingly, such a film suffers bad controllability of the transmission rate and film thickness and sometimes defects or the likes in the film. To the contrary, the cases of Embodiments 2 to 7, the film itself has good conductivity, and discharge keeps stable during film formations. Therefore, the film enjoyed good controllability of the transmission rate and film thickness and was free from defects in the film. Since rendering phase shift patterns conducting well, the film prevents the pattern from damaging due to static built-up during use of the mask.

If the containing rate of molybdenum (Mo) in the film is less than 8 atomic per cent (or if the ratio of metal to silicon in the target by atomic per cent is 1 to 19.0 or more), discharges become unstable because the surface of the target (erosion areas) becomes less conducting (or hard to feed voltage).

Acid Resistance

Figure 9:
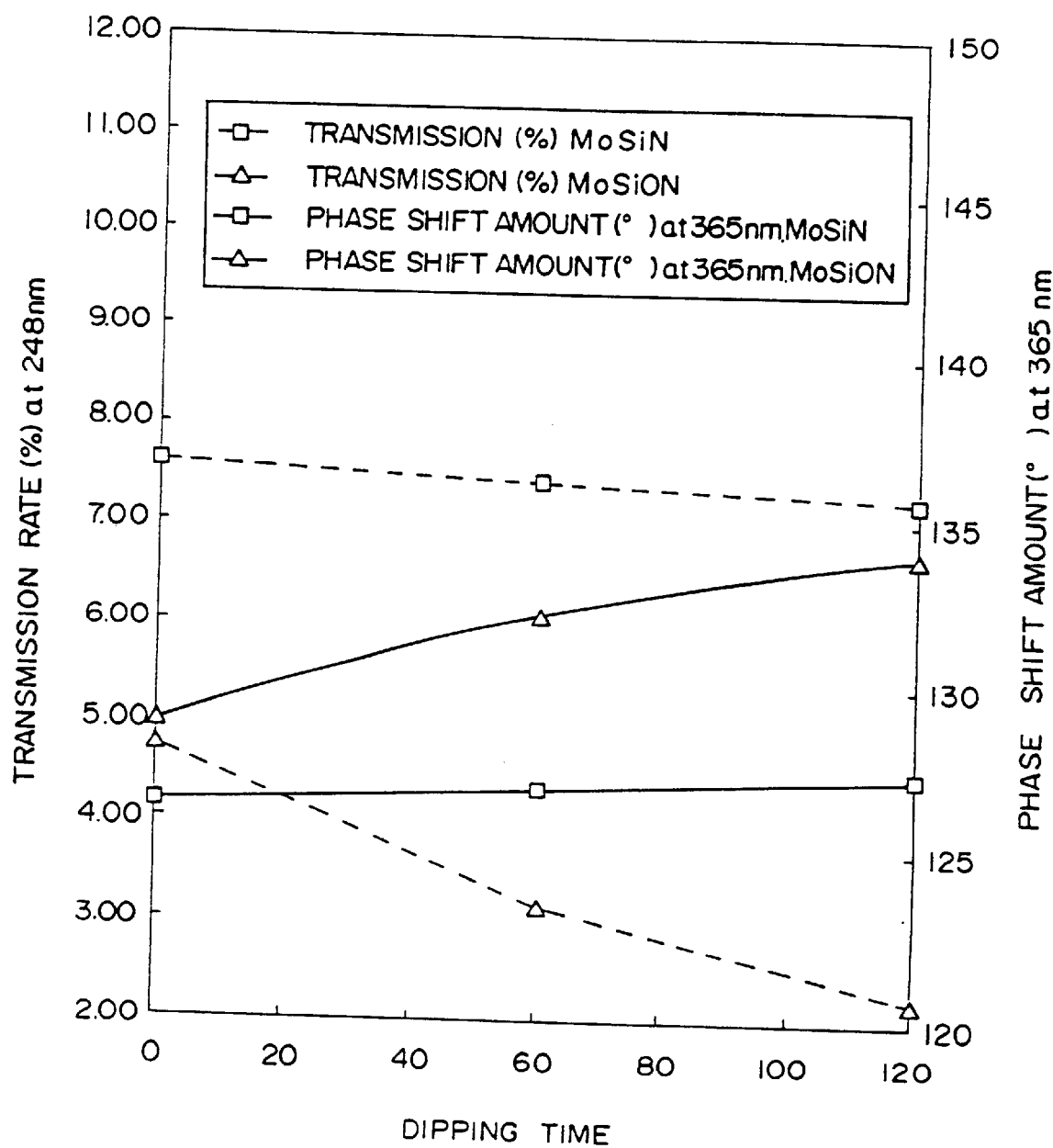
FIG. 9 is a diagram showing acid resistance of a phase shift mask blank according to the invention.

Acid resistance was examined by dipping blanks of molybdenum silicon nitride (MoSiN) according to the invention and of molybdenum silicon nitride oxide (MoSiON) in 96% sulfuric acid ($H_2SO_4$) of 100 Celsius degrees. The results are shown in FIG. 9. FIG. 9 shows changes of light transmission rate of the film at wavelength 248 nanometers and changes of phase shift amount of the film at wavelength 365 nanometers, against dipping time of the blanks in sulfuric acid.

As apparent from FIG. 9, where the film was dipped in the sulfuric acid of 100 Celsius degrees for 120 minutes, the change amounts of the light transmission rate and phase shift amount of the molybdenum silicon nitride (MoSiN) according to this invention was only about one eighth in terms of the transmission rate and about one sixth in terms of the phase shift amount, with respect to the change amount of the light transmission rate and phase shift amount of the molybdenum silicon nitride oxide (MoSiON) of Comparative Examples.

Figure 10:
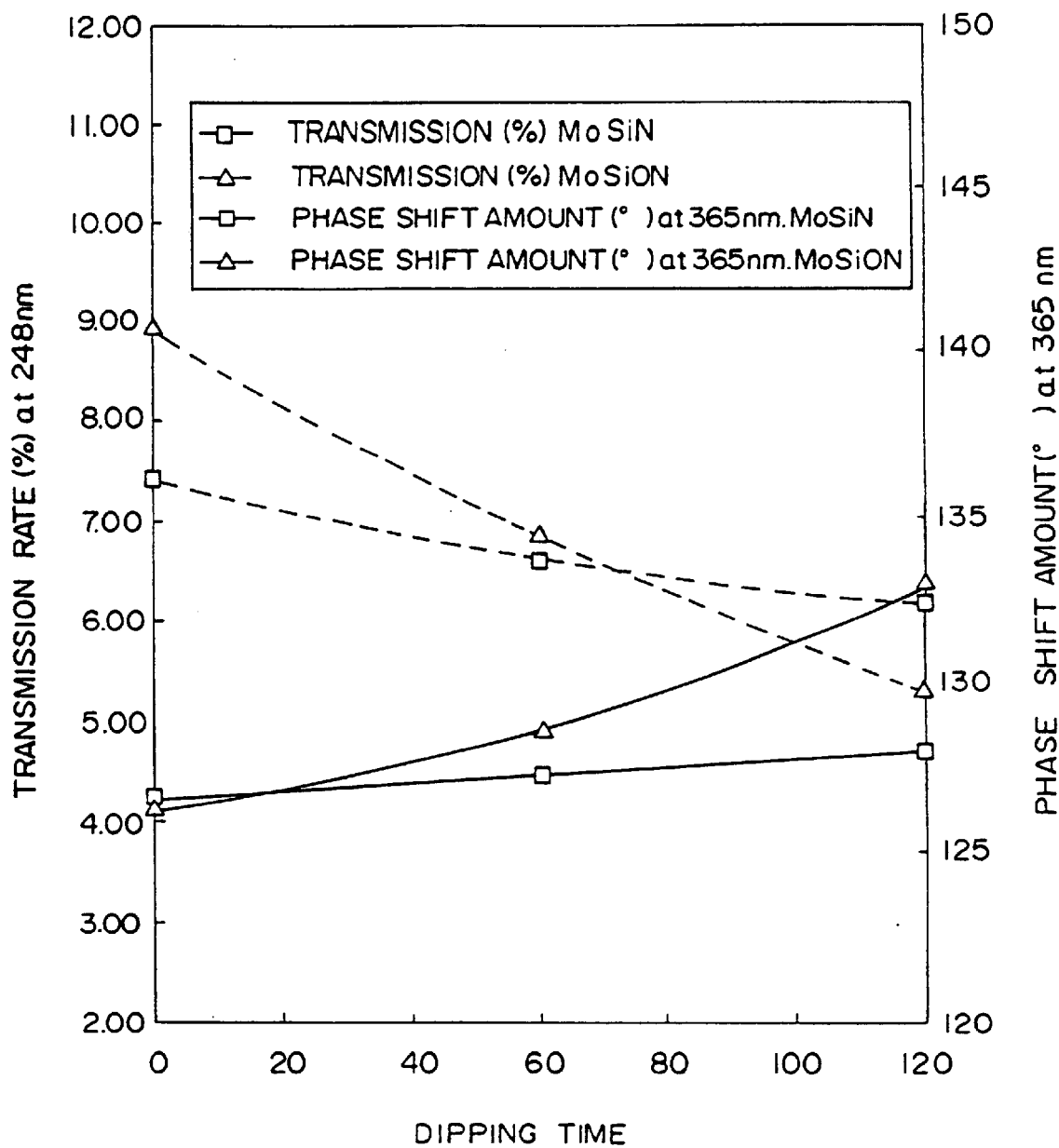
FIG. 10 is a diagram showing durability against alkali of the phase shift mask blank according to the invention.

Then, the sulfuric acid ($H_2SO_4$) of 100 Celsius degrees was replaced with 2% ammonia solution of 20 Celsius degrees, and alkali resistance was examined in the same manner as above. The results are shown in FIG. 10. FIG. 10 shows changes of light transmission rate of the film at wavelength 248 nanometers and changes of phase shift amount of the film at wavelength 365 nanometers, against dipping time of the Embodiment and Comparative Example blanks in the ammonia solution. As apparent from FIG. 10, where the film was dipped in the ammonia solution of 20 Celsius degrees for 120 minutes, the change amounts of the light transmission rate and phase shift amount of the molybdenum silicon nitride (MoSiN) according to this invention was only about one fifth in terms of the transmission rate and about one third in terms of the phase shift amount, with respect to the change amount of the light transmission rate and phase shift amount of the molybdenum silicon nitride oxide (MoSiON) of Comparative Examples. Consequently, the phase shift mask blank according to the invention has excellent property of alkali resistance.

In sum, the acid resistance examination for Embodiments No. 2 to 7 and Comparative Example 2 indicated, as shown in FIGS. 7, 8, as follows: the optical characteristics of the light transmission rate and phase shift amount (phase difference) of the phase shift mask obtained in Embodiments No. 2 to 7 were less deviated from the set values where the optical characteristics hardly change due to sulfuric acid rinsing during mask fabrications, and each embodiment had excellent acid resistance; one the other hand, the optical characteristics of the photo transmission rate and phase shift amount (phase difference) of the phase shift mask obtained in Comparative Example 2 were mush deviated from the set values where the optical characteristics so change due to sulfuric acid rinsing during mask fabrications, and Comparative Example No. 2 had a limited acid resistance. The light transmission rate of each phase shift mask obtained in Embodiments No. 2 to 7 is 2 or above, a high value.

Photo Resistance

Figure 11:
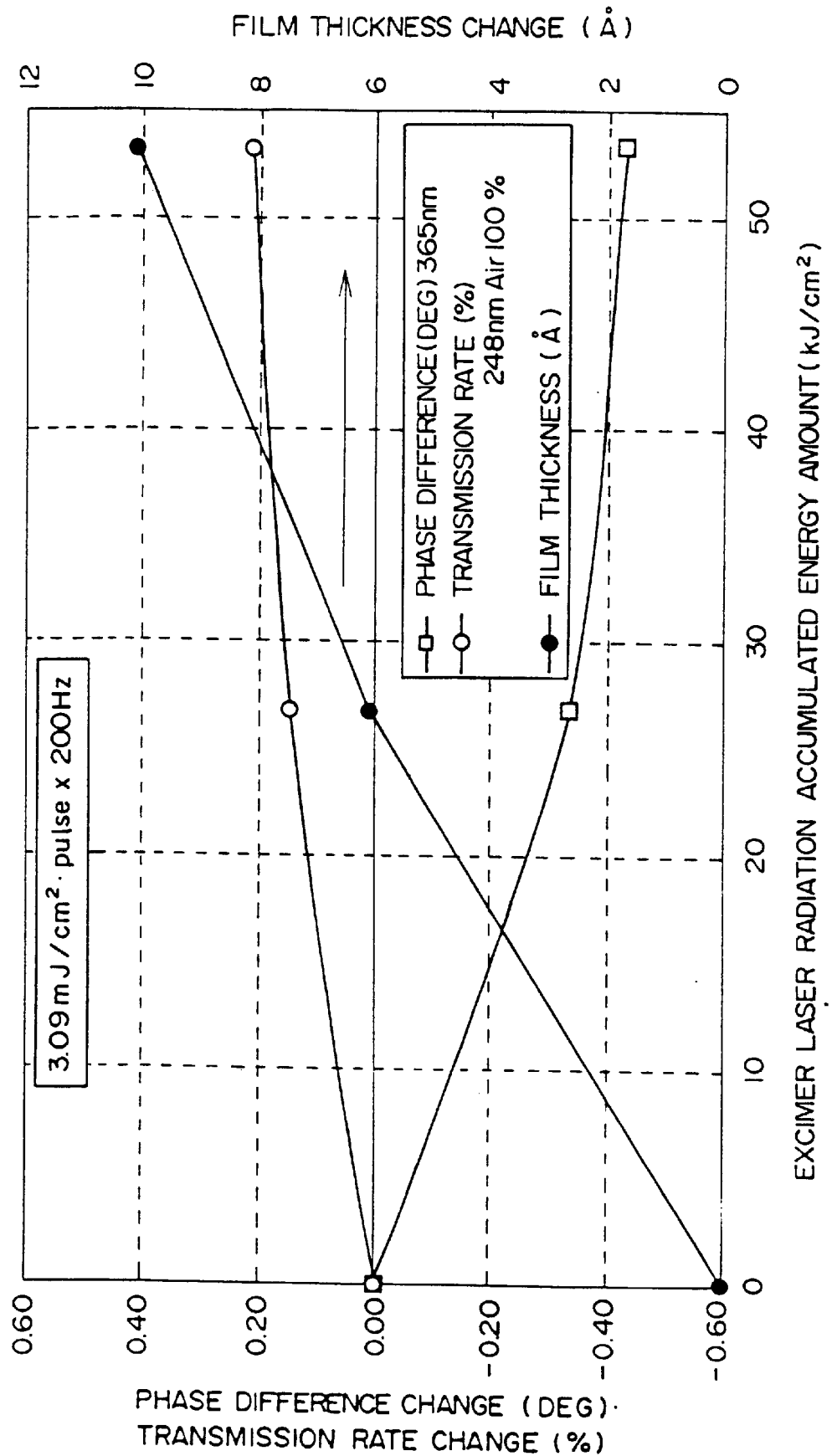
FIG. 11 is a diagram showing alkali resistance of the phase shift mask blank according to the invention.

The photo resistance of the blanks of the molybdenum silicon nitride according to the invention was evaluated. To examine this, changes of the light transmission rate (at wavelength 248 nanometers), phase shift amount (at wavelength 365 nanometers), and thickness were checked where KrF excimer laser beam (wavelength 248 nanometers) of 200 Hz, 3.09 mJ/cm$^2$, was so radiated onto MoSiN blanks that the accumulated radiation energy reached 53.3 kJ/cm$^2$. The results are shown in FIG. 11. As KrF excimer laser, we used LPX-200cc made by Lambda Physics Corp.

As apparent form FIG. 11, the MoSiN blanks according to the invention shows very slight changes of the transmission rate 0.21%, the phase shift amount −0.43 degree, and the thickness manometer, and appeared to have an excellent photo resistance.

As described above, the phase shift mask according to the invention has an excellent light translucent portion in terms of film characteristics such as acid resistance, photo resistance, conductivity, refractive index rate (film thickness), light transmission rate, etching selectivity, etc. by rendering the light translucent portion constituted of the thin film made of the material essentially including nitrogen, metal, and silicon and by specifying the containing rate (atomic per cent) and ratio of each element in the thin film, thereby satisfying the optical characteristics (i.e., photo transmission rate and phase shift amount) with high precision, as well as reducing defects.

The phase shift mask blank according to the invention satisfies the optical characteristics with high precision because of having the optimum film characteristics in consideration of manufacturing process and the likes. The phase shift mask blank also allows phase shift masks having less defective light translucent portions to be inexpensively and readily produced with high yield. With the manufacturing method for the phase shift mask blank according to the invention, the phase shift mask blanks with the light translucent portion having the excellent film characteristics can be produced in a stable manner with no defect upon specifying the composition of the target.

It is to be noted that although in the preferred embodiment, a DC sputtering was used, an RF sputtering can be used to form the thin film of the light translucent portion, though the DC sputtering is more effective. The thin film of the light translucent portion may be formed by sputtering using the target including metal, silicon, nitrogen rather than by the reactive sputtering, though the reactive sputter will produce less particles since discharge is relatively stable. Other inactive gases such as helium, neon, xenon, etc. can be used for formation of thin films. Moreover, as a metal, Ta, W, Ti, Cr or the likes can be used in lieu of Mo.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but the be defined claims set forth below.

What is claimed:

1. A method for manufacturing a phase shift mask which comprises a thin film mask pattern formed on a transparent substrate, said mask pattern comprising:

a light transmitting portion transmitting light having an intensity capable of substantially contributing to the exposure, and a light translucent portion formed of a thin film transmitting light having intensity substantially not contributing to the exposure and shifting a phase of said transmitted light so that the contrast of said exposure light in an area adjacent to the boundary between said light translucent portion and the light transmitting portion is improved by the difference in phase between said light translucent portion and the light transmitting portion wherein said method comprises the steps of:

preparing a transparent substrate;

forming a light translucent film on said transparent substrate, wherein said light translucent film consists essentially of nitrogen, metal and silicon, which comprises 34 to 60 atomic % of silicon;

forming a resist pattern on the said light translucent thin film;

etching said light translucent film by using said resist pattern as a mask to obtain a desired mask pattern comprising the light transmitting portion and the light translucent portion with a boundary between said portions; and rinsing at least the surface of said patterned film with sulfuric acid.

2. The manufacturing method according to claim 1, wherein the ratio of the atomic percent of said light translucent film is metal:silicon=1:1.5–6.0.

3. The manufacturing method according to claim 1, wherein said light translucent film includes nitrogen in a greater percent than silicon.

4. A method for manufacturing a phase shift mask which comprises a thin film mask pattern formed on a transparent substrate, said mask pattern comprising:

a light transmitting portion transmitting light having an intensity capable of substantially contributing to the exposure, and a light translucent portion formed of a thin film transmitting light having intensity substantially not contributing to the exposure and shifting a phase of said transmitted light so that the contrast of said exposure light in an area adjacent to the boundary between said light translucent portion and the light transmitting portion is improved by the difference in phase between said light translucent portion and the light transmitting portion wherein said method comprises the steps of:

preparing a transparent substrate;

forming a light translucent film on said transparent substrate, wherein said light translucent film consists essentially of nitrogen, metal and silicon, which comprises 34 to 60 atomic % of silicon and said metal is selected from the group consisting of molybdenum and titanium;

forming a resist pattern on the said light translucent thin film;

etching said light translucent film by using said resist pattern as a mask to obtain a desired mask pattern comprising the light transmitting portion and the light translucent portion with a boundary between said portions; and rinsing at least the surface of said patterned film with sulfuric acid.

5. The manufacturing method according to claim 4, wherein the ratio of the atomic percent of said light translucent film is metal:silicon=1:1.5–6.0.

6. The manufacturing method according to claim 4, wherein the content of nitrogen in said light translucent film is 30–60 atomic percent and nitrogen is included in a greater percent than silicon.

7. A method for manufacturing a phase shift mask which comprises a thin film mask pattern formed on a transparent substrate, said mask pattern comprising:

a light transmitting portion transmitting light having an intensity capable of substantially contributing to the exposure, and a light translucent portion formed of a thin film transmitting light having intensity substantially not contributing to the exposure and shifting a phase of said transmitted light so that the contrast of said exposure light in an area adjacent to the boundary between said light translucent portion and the light transmitting portion is improved by the difference in phase between said light translucent portion and the light transmitting portion wherein said method comprises the steps of:

forming a light translucent film on said transparent substrate, wherein said light translucent film consists essentially of nitrogen, metal and silicon, which comprises 8 to 18 atomic % of metal and said metal is selected from the group consisting of molybdenum and titanium;

forming a resist pattern on the said light translucent thin film;

etching said light translucent film by using said resist pattern as a mask to obtain a desired mask pattern comprising the light transmitting portion and the light translucent portion with a boundary between said portions; and rinsing at least the surface of said patterned film with sulfuric acid.

8. The manufacturing method according to claim 7, wherein the ratio of the atomic percent of said light translucent film is metal:silicon=1:1.5–6.0.

9. The manufacturing method according to claim 7, wherein the content of silicon in said light translucent film is 30–60 atomic percent and the content of nitrogen in said light translucent film is 30–60 atomic percent and nitrogen is included in a greater percent than silicon.

10. A method for manufacturing a phase shift mask which comprises a thin film mask pattern formed on a transparent substrate, said mask pattern comprising:

a light transmitting portion transmitting light having an intensity capable of substantially contributing to the exposure, and a light translucent portion formed of a thin film transmitting light having intensity substantially not contributing to the exposure and shifting a phase of said transmitted light so that the contrast of said exposure light in an area adjacent to the boundary between said light translucent portion and the light transmitting portion is improved by the difference in phase between said light translucent portion and the light transmitting portion wherein said method comprises the steps of:

forming a light translucent film on said transparent substrate, wherein said light translucent film consists essentially of nitrogen, metal and silicon, which comprises 34 to 60 atomic % of silicon and said metal is selected from the group consisting of molybdenum and titanium, wherein said film has a sheet resistance between 1K ohm per square (1K ohm/□)– 1.5M ohm per square (1.5M ohm/□);

forming a resist pattern on the said light translucent thin film;

etching said light translucent film by using said resist pattern as a mask to obtain a desired mask pattern comprising the light transmitting portion and the light translucent portion with a boundary between said portions; and rinsing at least the surface of said patterned film with sulfuric acid.

11. The manufacturing method according to claim 10, wherein the ratio of the atomic percent ofthe material forming the said light translucent film is metal:silicon= 1:1.5–6.0.

12. The manufacturing method according to claim 10, wherein the content of nitrogen in said light translucent film is 30–60 atomic percent and nitrogen is included in a greater percent than silicon.

13. A method for manufacturing a phase shift mask which comprises a thin film mask pattern formed on a transparent substrate, said mask pattern comprising:

a light transmitting portion transmitting light having an intensity capable of substantially contributing to the exposure, and a light translucent portion formed of a thin film transmitting light having intensity substantially not contributing to the exposure and shifting a phase of said transmitted light so that the contrast of said exposure light in an area adjacent to the boundary between said light translucent portion and the light transmitting portion is improved by the difference in phase between said light translucent portion and the light transmitting portion wherein said method comprises the steps of:

forming a light translucent film on said transparent substrate, wherein said light translucent film consists essentially of nitrogen, metal and silicon, which comprises 30 to 60 atomic % of nitrogen and said metal is selected from the group consisting of molybdenum and titanium;

forming a resist pattern on the said light translucent thin film;

etching said light translucent film by using said resist pattern as a mask to obtain a desired mask pattern comprising the light transmitting portion and the light translucent portion with a boundary between said portions; and rinsing at least the surface of said patterned film with sulfuric acid.

14. The manufacturing method according to claim 13, wherein the content of silicon in said light translucent film is 30–60 atomic percent and nitrogen is included in a greater percent than silicon.

15. The manufacturing method according to claim 13, wherein the content of silicon in the said mixed target is 70–95 mol %.

16. The manufacturing method according to claim 13, wherein the light translucent film is 8 to 18 atomic % of metal and said metal is selected from the group consisting of molybdenum and titanium.

17. A manufacturing method for the phase shift mask blank according to claim 15, wherein a thin film pattern is formed by photorisography on the said light translucent film.

18. A manufacturing method for the phase shift mask blank according to claim 16 wherein a thin film pattern is formed by photorisography on the said light translucent film.

19. A method for manufacturing a phase shift mask which comprises a thin film mask pattern formed on a transparent substrate, said mask pattern comprising:

a light transmitting portion transmitting light having an intensity capable of substantially contributing to the exposure, and a light translucent portion formed of a thin film transmitting light having intensity substantially not contributing to the exposure and shifting a phase of said transmitted light so that the contrast of said exposure light in an area adjacent to the boundary between said light translucent portion and the light transmitting portion is improved by the difference in phase between said light translucent portion and the light transmitting portion wherein said method comprises the steps of:

forming a light translucent film on said transparent substrate, wherein said light translucent film consists essentially of nitrogen, metal and silicon by leaving said transparent substrate in an atmosphere of mixed gas including nitrogen and DC sputtering atarget consisting essentially of metal and silicon;

forming a resist pattern on the said light translucent thin film; and etching said light translucent film by using said resist pattern as a mask to obtain a desired mask pattern comprising the light transmitting portion and the light translucent portion with a boundary between said portions.

* * * * *